(12) United States Patent
Sohn et al.

(10) Patent No.: US 12,176,241 B2
(45) Date of Patent: Dec. 24, 2024

(54) SUPPORT STRUCTURE FOR THERMAL PROCESSING SYSTEMS (71) Applicants: Mattson Technology, Inc., Fremont, CA (US); Beijing E-Town Semiconductor Technology Co., Ltd., Beijing (CN)

(72) Inventors: Manuel Sohn, Neu-Ulm (DE); Rolf Bremensdorfer, Bibertal (DE); Silke Hamm, Laupheim (DE); Alex Wansidler, Ulm (DE)

(73) Assignees: Beijing E-Town Semiconductor Technology Co., Ltd., Beijing (CN); Matson Technology, Inc., Fremont, CA (US)

( * ) Notice: Subject to any disclaimer, the term of this patent is extended or adjusted under 35 U.S.C. 154(b) by 976 days.

(21) Appl. No.: 17/183,862

(22) Filed: Feb. 24, 2021

(65) Prior Publication Data
US 2021/0272839 A1    Sep. 2, 2021

Related U.S. Application Data (60) Provisional application No. 62/983,032, filed on Feb. 28, 2020.

(51) Int. Cl.
*H01L 21/687* (2006.01)
*C23C 14/30* (2006.01)
(Continued)

(52) U.S. Cl.
CPC ........ *H01L 21/68742* (2013.01); *C23C 14/30* (2013.01); *C23C 14/50* (2013.01); *H01L 21/67115* (2013.01); *H01L 21/68757* (2013.01)

(58) Field of Classification Search
CPC ......... H01L 21/68742; H01L 21/67115; H01L 21/68757; H01L 21/67248; C23C 14/30; C23C 14/50
See application file for complete search history.

(56) References Cited

U.S. PATENT DOCUMENTS 6,374,508 B1    4/2002  Yudovsky et al.
8,003,920 B2 *  8/2011  Hayashi ............ H01L 21/68742
                                                 219/390

(Continued)

FOREIGN PATENT DOCUMENTS

CN    112236850 A    1/2021
CN    112509969 A    6/2021
(Continued)

OTHER PUBLICATIONS

International Search Report and Written Opinion on Patentability for Application No. PCT/US2021/019433, mailed Jun. 15, 2021, 10 pages.

(Continued)

*Primary Examiner* — Shawntina T Fuqua
(74) *Attorney, Agent, or Firm* — Dority & Manning, P.A.

(57) ABSTRACT

Support plates and support structures for thermal processing systems to heat workpieces are provided. In one example, a thermal processing apparatus is provided that includes a plurality of heat sources, a rotatable support plate, and a support structure having a flexibility in the radial direction of the rotatable support plate that is greater than a flexibility in the azimuthal direction of the rotatable support plate. Also provided are support plates for supporting a workpiece in a thermal processing apparatus. The support plate can include a base defining a radial direction and an azimuthal direction and at least one support structure extending from the base having a flexibility in the radial direction of the base that is (Continued)

greater than a flexibility in the azimuthal direction of the base.

18 Claims, 5 Drawing Sheets

(51) Int. Cl.
*C23C 14/50* (2006.01)
*H01L 21/67* (2006.01)

(56) References Cited

U.S. PATENT DOCUMENTS

| | | |
|---|---|---|
| 9,355,883 B2 | 5/2016 | Hohenwarter et al. |
| 9,536,770 B2 | 1/2017 | Brugger et al. |
| 9,972,514 B2 | 5/2018 | Hammer et al. |
| 2008/0124207 A1 | 5/2008 | Shimai |
| 2019/0326153 A1 | 10/2019 | Sasaki et al. |

FOREIGN PATENT DOCUMENTS

| | | | | |
|---|---|---|---|---|
| DE | 112015005137 T5 * | 8/2017 | ............. | H01L 21/26 |
| JP | 4824590 | 11/2011 | | |
| KR | 10-1433864 | 9/2014 | | |
| KR | 10-1738986 | 5/2017 | | |
| WO | WO-2005124840 A1 * | 12/2005 | ........ | H01L 21/67115 |

OTHER PUBLICATIONS

Excerpt from Bremensdorfer, Reduction of Backside Defects in RTP Tools Presentation, presented by Mattson Technology, RTP User Meeting, Erlangen, Germany, Sep. 2018, 5 pages.

* cited by examiner

SUPPORT STRUCTURE FOR THERMAL PROCESSING SYSTEMS

PRIORITY CLAIM

The present application claims the benefit of priority of U.S. Provisional Application Ser. No. 62/983,032, filed on Feb. 28, 2020, titled "Support Structure for Thermal Processing Systems," which is incorporated herein by reference.

FIELD

The present disclosure relates generally to support structure(s) for thermal processing systems.

BACKGROUND

A thermal processing chamber as used herein refers to a device that heats workpieces, such as semiconductor wafers. Such devices can include a support plate for supporting one or more semiconductor wafers and an energy source for heating the semiconductor workpieces, such as heating lamps, lasers, or other heat sources. During heat treatment, the semiconductor workpieces can be heated under controlled conditions according to a preset temperature regime.

Many semiconductor heating processes require a workpiece to be heated to high temperatures so that various chemical and physical transformations can take place as the workpiece is fabricated into a device(s). During rapid thermal processing, for instance, semiconductor workpieces can be heated by an array of lamps through the support plate to temperatures from about 300° C. to about 1,200° C., for times that are typically less than a few minutes. During these processes, a primary goal can be to heat the workpieces as uniformly as possible.

SUMMARY

Aspects and advantages of embodiments of the present disclosure will be set forth in part in the following description, or may be learned from the description, or may be learned through practice of the embodiments.

One example aspect is directed to a thermal processing apparatus. The thermal processing apparatus includes a plurality of heat sources configured to heat a workpiece; a rotatable support plate operable to support the workpiece during thermal processing the rotatable support plate defining a radial direction and an azimuthal direction; and a support structure extending from the rotatable support plate, the support structure configured to contact the workpiece during thermal processing, the support structure comprising a first end and a second end, wherein the first end of the support structure is arranged to support the workpiece during thermal processing, wherein the support structure has a flexibility in the radial direction of the rotatable support plate that is greater than a flexibility in the azimuthal direction of the rotatable support plate.

Other aspects are directed to a support plate for supporting a workpiece in a thermal processing apparatus. The support plate includes a base defining a radial direction and an azimuthal direction; and at least one support structure extending from the base, the at least one support structure configured to support the workpiece during thermal processing; wherein the support structure has a flexibility in the radial direction of the base that is greater than a flexibility in the azimuthal direction of the base.

Other example aspects are directed to systems, methods, devices, and processes for thermally treating a semiconductor substrate. Variations and modifications can be made to example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to support structures for use in thermal processing systems used to heat workpieces, such as semiconductor workpieces, opto-electronic workpieces, flat panel displays, or other suitable workpieces. The workpiece materials can include, for instance, silicon, silicon germanium, glass, plastic, or other suitable material. In some embodiments, the workpieces can be semiconductor wafers. The support structures can be used to support workpieces in various thermal processing systems that implement a variety of workpiece manufacturing processes, including, but not limited to vacuum anneal processes, rapid thermal processes, etc.

A thermal processing chamber can include a heat source configured to emit light ranging from an ultraviolet to a near infrared electromagnetic spectrum. In order to expose one side or both sides of a workpiece to the heat source, the workpiece is supported by one or more support pins mounted onto a carrier structure, typically a base below the workpiece. The support pins and the base form a support plate. In some configurations, the base is made from a highly transparent, uniform material (e.g., quartz glass) as to not obstruct light from the heat sources. The workpiece may be supported by pins made from quartz glass. However, during heat cycling, these pins can cause mechanical damage to the backside of the workpiece, such as scratches, imprints, build-ups, and surface particles. Subsequent workpiece processing can be negatively affected given the mechanical damage to the workpiece. For example, backside damage and particles are known sources for causing focusing issues during subsequent lithography processing.

Much of the damage to the backside of the workpiece can be caused by relative movement between the pin tip and the workpiece backside during a heat cycle. For example, during the heat cycle the workpiece experience thermal expansion and contraction causing movement on the workpiece when it is placed on a pin support. The quartz pin supports are often rigidly attached to a supporting plate. Thus, mechanical damage occurs to the backside of the workpiece when it moves against the rigid pin supports.

Other attempted solutions to reduce backside workpiece damage have mainly addressed damage caused by contact force. For example, enlarging the contact area, the pin tip shape, or by spring loading the pins in a vertical direction to lower the impact stress during workpiece loading. These attempted solutions, however, did not prevent scratches from forming on the backside of the workpiece.

Typically, circular imprints are already generated when placing a cold workpiece onto support pins. These imprints are caused by the high contact pressure exerted by the pinpoint tip. However, after heat treatment the pin marks are now scratches which are radially oriented. This suggests that the scratches are linked to the thermal expansion of the silicon workpiece rather than the acceleration or deceleration action of the workpiece rotation. The latter would cause azimuthally oriented scratches. The length of the scratches is in good agreement with the thermal expansion estimated from the properties of silicon and the distance of the pins from the workpiece center. Therefore, scratches are caused by rigid pin tips acting on the workpiece backside during the thermal expansion of the workpiece when heating up and the thermal contraction of the workpiece when cooling down.

According to example aspects of the present disclosure, a support structure can include a rotatable support plate. The support plate can include a base defining a radial direction and an azimuthal direction and at least one support structure (e.g., support pin) extending from the base. The support structure has a flexibility in the radial direction of the base that is greater than the azimuthal direction of the base.

In this way, example aspects of the present disclosure can provide a number of technical effects and benefits. For example, the support structure(s) provided herein (e.g., pins) can be mounted in such a way that it can yield to the thermal expansion of the workpiece while being rigid enough to allow for workpiece rotation. During heat treatment, thermal expansion acts only in the radial direction, whereas rotational forces act in an azimuthal direction. The support structure(s) provided herein is movable such that it can yield to thermal expansion and contraction while, at the same time, transfer rotational momentum to the workpiece.

Accordingly, provided are workpiece support structures, such as pins, that are more flexible in a radial direction versus the azimuthal direction. Further, the support structures provided herein are capable of moving and "righting" themselves, otherwise contraction of the workpiece during cool down would again generate scratches on the backside of the workpiece. Also, advantageously, the support structures provided herein are capable of being manufactured from quartz glass. The support structures provided herein have a contact area with the workpiece that is as small as possible to minimize thermal conduction. The overall lateral dimensions of the support structure(s) are also as small as possible to avoid shadowing on the workpiece.

Variations and modifications can be made to these example embodiments of the present disclosure. As used in the specification, the singular forms "a," "and," and "the" include plural referents unless the context clearly dictates otherwise. The use of "first," "second," "third," etc., are used as identifiers and are not necessarily indicative of any ordering, implied or otherwise. Example aspects may be discussed with reference to a "substrate," "wafer," or "workpiece" for purposes of illustration and discussion. Those of ordinary skill in the art, using the disclosures provided herein, will understand that example aspects of the present disclosure can be used with any suitable workpiece. The use of the term "about" in conjunction with a numerical value refers to within 20% of the stated numerical value.

Example embodiments provide a thermal processing apparatus that includes a plurality of heat sources configured to heat a workpiece; a rotatable support plate operable to support the workpiece during thermal processing the rotatable support plate defining a radial direction and an azimuthal direction; and a support structure extending from the rotatable support plate. The support structure is configured to contact the workpiece during thermal processing. The support structure further has a flexibility in the radial direction of the rotatable support plate that is greater than a flexibility in the azimuthal direction of the rotatable support plate.

Example embodiments provide a support plate for supporting a workpiece in a thermal processing apparatus. The support plate includes a base defining a radial direction and an azimuthal direction and at least one support structure extending from the base. The support structure is configured to support a workpiece during thermal processing. The support structure has a flexibility in the radial direction of the base that is greater than a flexibility in the azimuthal direction of the base. The support structure can include one or more support pins, such as three support pins. In some embodiments, the support structure includes a key-shaped end configured to secure the support structure to the base. In some embodiments, the support structure includes a pivot and a counterweight, and the base includes one or more recessed pockets configured to engage the pivot of the support structure to secure the support structure to the base. Still, in other embodiments, the base includes a support structure mount configured to releasably secure the support structure to the base. The support structure mount can be configured such that tilting momentum of the support structure in the radial direction is greater than in the azimuthal direction.

Figure 1:
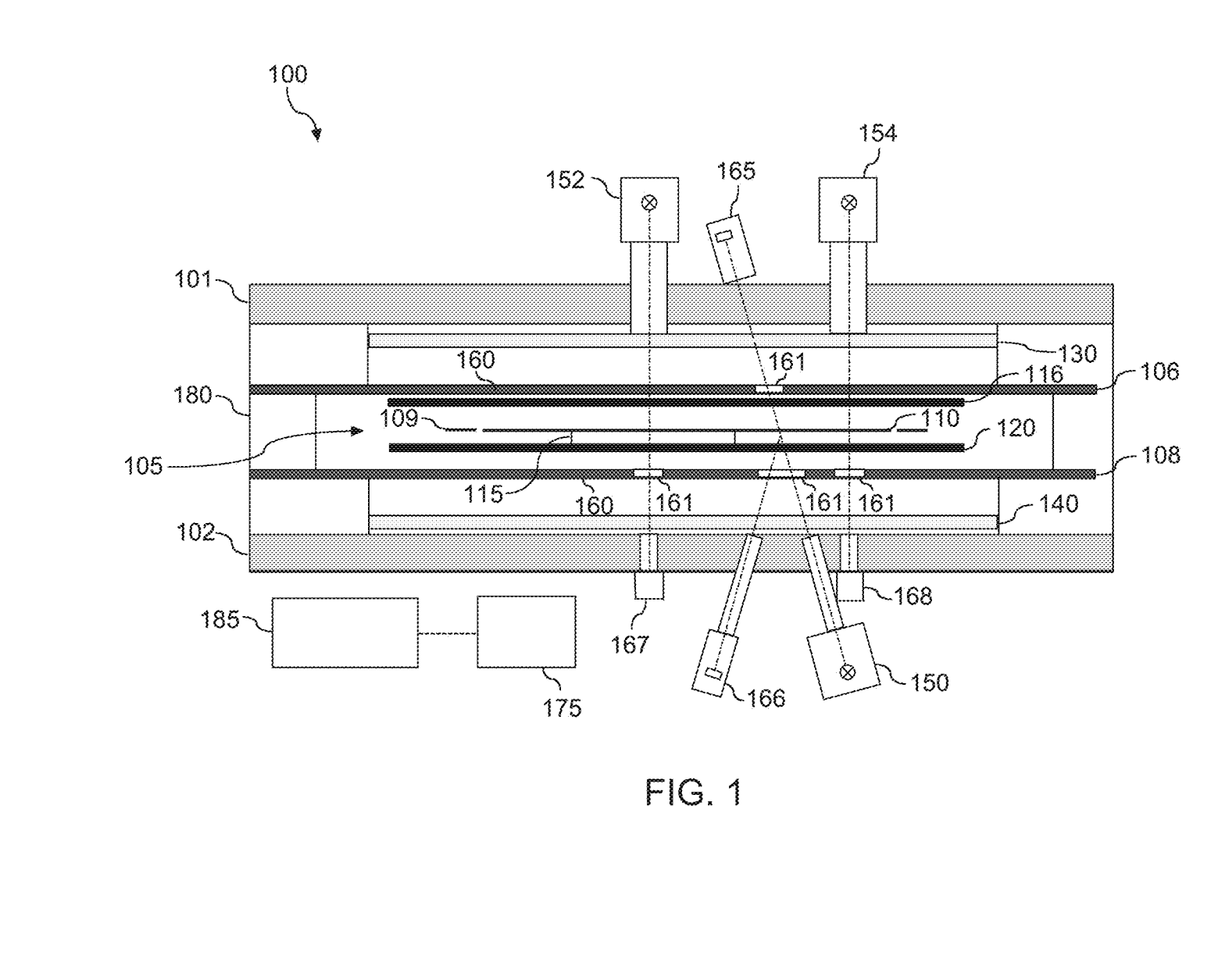
FIG. 1 depicts an example rapid thermal processing (RTP) apparatus according to example embodiments of the present disclosure.

With reference now to the FIGS., example embodiments of the present disclosure will now be discussed in detail. FIG. 1 depicts an example rapid thermal processing (RTP) system 100 according to example embodiments of the present disclosure. As illustrated, the RTP system 100 includes an RTP chamber 105 including a top 101 and bottom 102, windows 106, 108, workpiece 110, rotatable support plate 120, heat sources 130, 140 (e.g., heating lamps), infrared emitters 150, 152, 154, pyrometers 165, 166, 167, 168, controller 175, sidewall/door 180, and gas flow controller 185.

The workpiece 110 to be processed is supported in the RTP chamber 105 (e.g., a quartz RTP chamber) by the rotatable support plate 120. The rotatable support plate 120 can be a workpiece support operable to support a workpiece 110 during thermal processing. Workpiece 110 can be or include any suitable workpiece, such as a semiconductor wafer, such as a silicon wafer. In some embodiments, workpiece 110 can be or include a lightly doped silicon wafer. For example, a lightly doped silicon wafer can be doped such that a resistivity of the silicon wafer is greater than about 0.1 Ωcm, such as greater than about 1 Ωcm.

Rotatable support plate 120 can be or include any suitable support structure configured to support workpiece 110, such as to support workpiece 110 in RTP chamber 105. In some embodiments, rotatable support plate 120 can be configured to support a plurality of workpieces 110 for simultaneous thermal processing by a thermal processing system. In some embodiments, rotatable support plate 120 can rotate workpiece 110 before, during, and/or after thermal processing. In some embodiments, rotatable support plate 120 can be transparent to and/or otherwise configured to allow at least some electromagnetic radiation to at least partially pass through rotatable support plate 120. For instance, in some embodiments, a material of rotatable support plate 120 can be selected to allow desired electromagnetic radiation to pass through rotatable support plate 120, such as electromagnetic radiation that is emitted by workpiece 110 and/or emitters 150, 152, 154. In some embodiments, rotatable support plate 120 can be or include a quartz material, such as a hydroxyl free quartz material.

Rotatable support plate 120 can include at least one support structure, such as a support pin 115 extending from rotatable support plate 120. In some embodiments, rotatable support plate 120 can be spaced from top plate 116. In some embodiments, the support pins 115 and/or the rotatable support plate 120 can transmit heat from heat sources 140 and/or absorb heat from workpiece 110. In some embodiments, the support pins 115, guard ring 109, and top plate 116 can be made of quartz.

A guard ring 109 can be used to lessen edge effects of radiation from one or more edges of the workpiece 110. Sidewall/door 180 allows entry of the workpiece 110 and, when closed, allows the chamber 105 to be sealed, such that thermal processing can be performed on workpiece 110. For example, a process gas can be introduced into the RTP chamber 105. Two banks of heat sources 130, 140 operable to heat the workpiece 110 in the RTP chamber 105 (e.g., lamps, or other suitable heat sources) are shown on either side of the workpiece 110. Windows 106, 108 can be configured to block at least a portion of radiation emitted by the heat sources 130, 140, as described more particularly below.

RTP system 100 can include heat sources 130, 140. In some embodiments, heat sources 130, 140 can include one or more heating lamps. For example, heat sources 130, 140 including one or more heating lamps can emit electromagnetic radiation (e.g., broadband electromagnetic radiation) to heat workpiece 110. In some embodiments, for example, heat sources 130, 140 can be or include arc lamps, tungsten-halogen lamps, and/or any other suitable heating lamp, and/or combination thereof. In some embodiments, directive elements (not depicted) such as, for example, reflectors (e.g., mirrors) can be configured to direct electromagnetic radiation from heat sources 130, 140 into RTP chamber 105.

According to example aspects of the present disclosure, windows 106, 108 can be disposed between workpiece 110 and heat sources 130, 140. Windows 106, 108 can be configured to selectively block at least a portion of electromagnetic radiation (e.g., broadband radiation) emitted by heat sources 130, 140 from entering a portion of rapid thermal processing chamber 105. For example, windows 106, 108 can include opaque regions 160 and/or transparent regions 161. As used herein, "opaque" means generally having a transmittance of less than about 0.4 (40%) for a given wavelength, and "transparent" means generally having a transmittance of greater than about 0.4 (40%) for a given wavelength.

Opaque regions 160 and/or transparent regions 161 can be positioned such that the opaque regions 160 block stray radiation at some wavelengths from the heat sources 130, 140, and the transparent regions 161 allow, for example, emitters 150, 152, 154 and/or pyrometers 165, 166, 167, 168 to freely interact with radiation in RTP chamber 105 at the wavelengths blocked by opaque regions 160. In this way, the windows 106, 108 can effectively shield the RTP chamber 105 from contamination by heat sources 130, 140 at given wavelengths while still allowing the heat sources 130, 140 to heat workpiece 110. Opaque regions 160 and transparent regions 161 can generally be defined as opaque and transparent, respectively, to a particular wavelength; that is, for at least electromagnetic radiation at the particular wavelength, the opaque regions 160 are opaque and the transparent regions 161 are transparent.

Chamber windows 106, 108, including opaque regions 160 and/or transparent regions 161, can be formed of any suitable material and/or construction. In some embodiments, chamber windows 106, 108 can be or include a quartz material. Furthermore, in some embodiments, opaque regions 160 can be or include hydroxyl (OH) containing quartz, such as hydroxyl doped quartz (e.g., quartz that is doped with hydroxyl), and/or transparent regions 161 can be or include hydroxyl free quartz (e.g., quartz that is not doped with hydroxyl). Advantages of hydroxyl doped quartz and hydroxyl free quartz can include an ease of manufacturing. For instance, the hydroxyl free quartz regions can be shielded during hydroxyl doping of a monolithic quartz window to produce both hydroxyl doped regions (e.g., opaque regions) and hydroxyl free regions (e.g., transparent regions) in the monolithic window. Additionally, hydroxyl doped quartz can exhibit desirable wavelength blocking properties in accordance with the present disclosure. For instance, hydroxyl doped quartz can block radiation having a wavelength of about 2.7 micrometers, which can correspond to a measurement wavelength at which some sensors (e.g., pyrometers 165, 166, 167, 168) in the thermal processing system 100 operate, while hydroxyl free quartz can be transparent to radiation having a wavelength of about 2.7 micrometers. Thus, the hydroxyl doped quartz regions can shield the sensors (e.g., pyrometers 165, 166, 167, 168) from stray radiation in the rapid thermal processing chamber 105 (e.g., from heat sources 130, 140), and the hydroxyl free quartz regions can be disposed at least partially within a field of view of the sensors to allow the sensors to obtain measurements within the thermal processing system. Additionally, hydroxyl doped quartz can be partially opaque (e.g., have a transmittance around 0.6, or 60%) to radiation having a wavelength of about 2.3 micrometers, which can at least partially reduce contamination from stray radiation in rapid thermal processing system 100 (e.g., from heat sources 130, 140).

Gas controller 185 can control a gas flow through RTP system 100, which can include an inert gas that does not react with the workpiece 110 and/or a reactive gas such as oxygen or nitrogen that reacts with the material of the workpiece 110 (e.g. a semiconductor wafer, etc.) to form a layer of on the workpiece 110. In some embodiments, an electrical current can be run through the atmosphere in RTP system 100 to produce ions that are reactive with or at a surface of workpiece 110, and to impart extra energy to the surface by bombarding the surface with energetic ions.

The controller 175 controls various components in RTP chamber to direct thermal processing of workpiece 110. For example, controller 175 can be used to control heat sources 130 and 140. Additionally and/or alternatively, controller 175 can be used to control the gas flow controller 185, the door 180, and/or a temperature measurement system, including, for instance, emitters 150, 152, 154 and/or pyrometers 165, 166, 167, 168. The controller 175 can be configured to measure a temperature of the workpiece As used herein, a controller, control system, or similar can include one or more processors and one or more memory devices. The one or more processors can be configured to execute computer-readable instructions stored in the one or more memory devices to perform operations, such as any of the operations for controlling a thermal processing system described herein.

FIG. 1 depicts an example thermal processing system 100 for purposes of illustration and discussion. Those of ordinary skill in the art, using the disclosures provided herein, will understand that aspects of the present disclosure can be used with other thermal processing systems for workpieces without deviating from the scope of the present disclosure.

Figure 2:
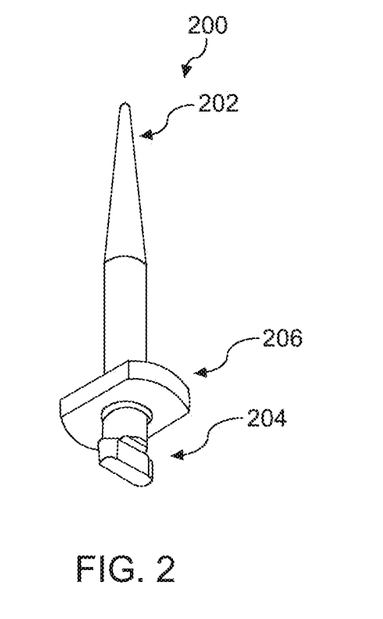
FIG. 2 depicts an example support structure according to example embodiments of the present disclosure.

FIG. 2 depicts an example support structure for a workpiece, such as a pin. As shown, the support structure 200 has a first end 202 and a second 204. The first end 202 is arranged such that it is capable of supporting a workpiece during thermal processing. In some embodiments, the first end 202 is a tapered end and the second end 204 is a blunt end. The support structure 200 further includes a base plate 206. The base plate 206 is configured in size and shape such that it can engage with one or more openings present on a rotatable support plate in order to secure the support structure 200 to a rotatable support plate. The base plate 206 can include any shape, i.e. rectangular, ovular, circular, triangular, etc., as long as the base plate 206 shape is complementary to the openings present in the rotatable support plane. For example, in embodiments where the base plate 206 is rectangular, the rotatable support plate includes similarly sized and shaped rectangular openings or recesses for accepting the base plate 206 and securing the base plate 206 to the rotatable support plate. The support structure 200 also includes a key-shaped end 208. The key-shaped end 208 is configured to secure the support structure 200 to a rotatable support plate. The key-shaped end 208 can be rotated in order to lock the support structure 200 in place in the rotatable support plate. The mechanical dimensions of the lock and key arrangement of the key-shaped end 208 are such that radial movement of the support structure 200 is not impeded. In some embodiments, the support structure has a length of about 10 mm to about 20 mm, such as about 17 mm. In certain embodiments, the support structure has a diameter of about 1.0 mm to about 2 mm, such as about 1.5 mm.

Figure 3:
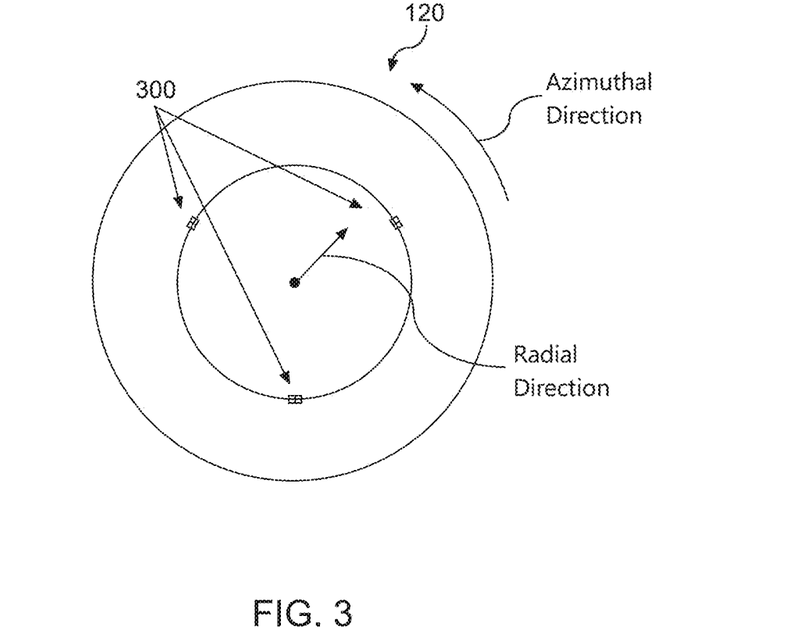
FIG. 3 depicts an example rotatable support plate according to example embodiments of the present disclosure.

FIG. 3 illustrates a rotatable support plate 120 having one or more openings 300 configured to engage the base plate 206 of the support structure 200. The rotatable support plate can move in a radial direction and/or an azimuthal direction as shown in FIG. 3. The one or more openings 300 can include pockets or apertures configured to engage the base plate 206 of the support structure 200 and secure the support structure 200 to the rotatable support plate 120. In certain embodiments, the one or more openings 300 are oriented on the rotatable support plate 120 such that tilting momentum of the support structure 200 in the radial direction is greater than in the azimuthal direction. For example, in certain embodiments where the one or more openings 300 are rectangular in nature, the short side of the rectangle is oriented in the radial direction (as shown in FIG. 3), whereas the long side of the rectangle is oriented in the azimuthal direction (as shown in FIG. 3). This orientation ensures that the tilting torque in the radial direction is smaller than the tilting torque in the azimuthal direction. Accordingly, support structures 200 that are oriented in the rotatable support plate 120 in this manner are more rigid in the azimuthal direction and more moveable or flexible in the radial direction.

Figure 4:
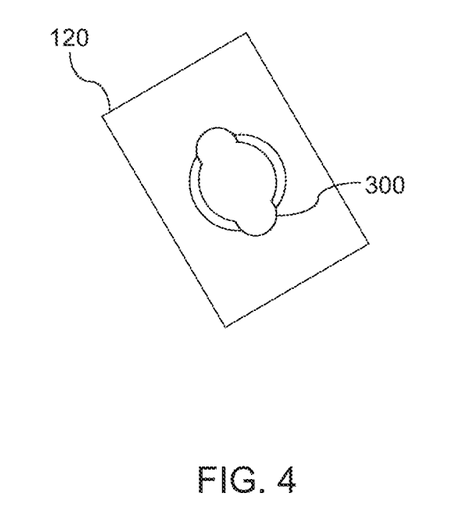
FIG. 4 depicts an example recessed opening on a rotatable support plate according to example embodiments of the present disclosure.
Figure 5:
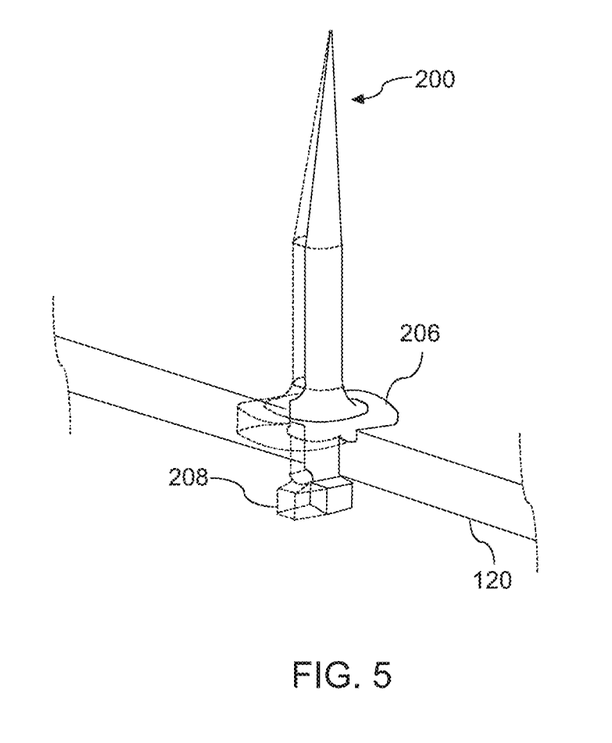
FIG. 5 depicts an example rotatable support plate and support structure according to example embodiments of the present disclosure.

The one or more openings 300 can include a variety of shapes such as rectangular, ovular or elliptical, circular, rhomboidal, etc., so long as the one or more openings 300 are complementary in shape to the base plate 206 of the support structure 200. FIG. 4 provides an example opening 300 that is generally circular or ovular in nature. Furthermore, the opening 300 is configured such that the key-shaped end 208 of a support structure 200 is capable of fitting through the opening 300 while a portion of the base plate remains within the opening 300. Accordingly, when the support structure 200 is inserted into the opening 300 the top surface of the base plate 206 may be flush with the surface of the rotatable support plate 120. (As shown in FIG. 5). In some embodiments, the top surface of the base plate 206 may extend above the top surface of the rotatable support plate 120. The support structure 200 must be configured such that it stays put in place and cannot easily be pulled out from the rotatable support plate 120. Thus, in certain embodiments when the support structure 200 is inserted in the opening 300, the key-shaped end 208 of the support structure 200 extends below the bottom surface of the rotatable support plate 120. The key-shaped end 208 can then be rotated, for example by one-quarter turn, to lock the support structure 200 into place on the rotatable support plate 120. (See FIG. 5). Accordingly, in certain embodiments, the support structure 200 includes a key-shaped end 208 configured to secure the support structure 200 to the rotatable support plate 120.

Figure 6:
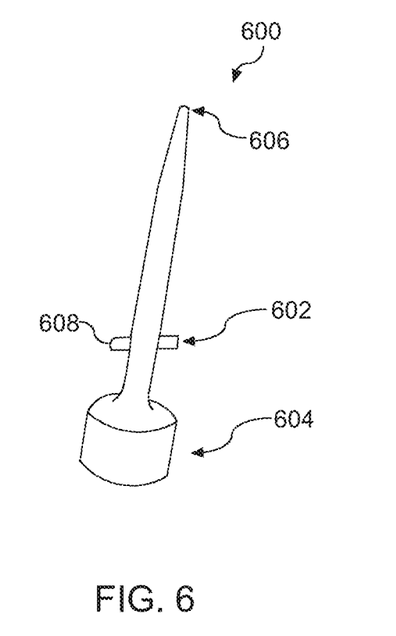
FIG. 6 depicts an example support structure according to example embodiments of the present disclosure.
Figure 7:
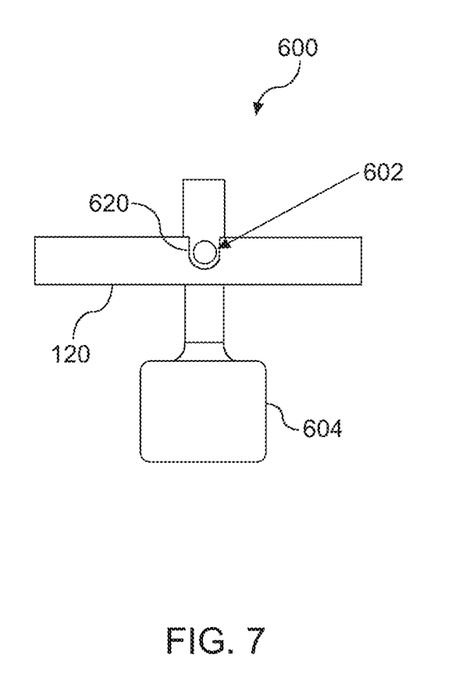
FIG. 7 depicts an example support structure according to example embodiments of the present disclosure.

FIG. 6 illustrates another example embodiment of a support structure 600. In this embodiment, the support structure 600 includes a pivot 602 and has one end configured as a counterweight 604. The support structure 600 further includes a first end 606 designed to engage and support a workpiece during processing. In some embodiments, the pivot 602 includes a pin 608 configured to be removably secured to the support structure 200. For example, in certain embodiments the pin 608 may be inserted into an opening located along the shaft of the support structure 200. In this manner, the support structure 600 can pivot about an axis fixed to the shaft of the support structure 600. The rotatable support plate 120 can further include one or more recessed pockets or openings configured to engage the pivot 602 of the support structure 600. In this manner, the support structure 600 can be secured to the rotatable support plate 120. (See FIG. 7). In certain embodiments, the rotatable support plate 120 includes a bearing support 620 configured to receive the axis of the pivot 602. In certain embodiments, the bearing support 620 is configured to receive the pin 608 of the support structure 600. The bearing support 620 can be machined into the rotatable support plate 120. One end of the support structure 600 is shaped into a counterweight 604. When the support structure 600 is configured to the rotatable support plate 120, the counterweight 604 extends below the bottom surface of the rotatable support plate 120. The counterweight 604 provides the necessary righting momentum for ensuring that the support structure 600 has greater flexibility in radial direction of the rotatable support plate 120 as compared to the azimuthal direction of the rotatable support plate 120.

Figure 8:
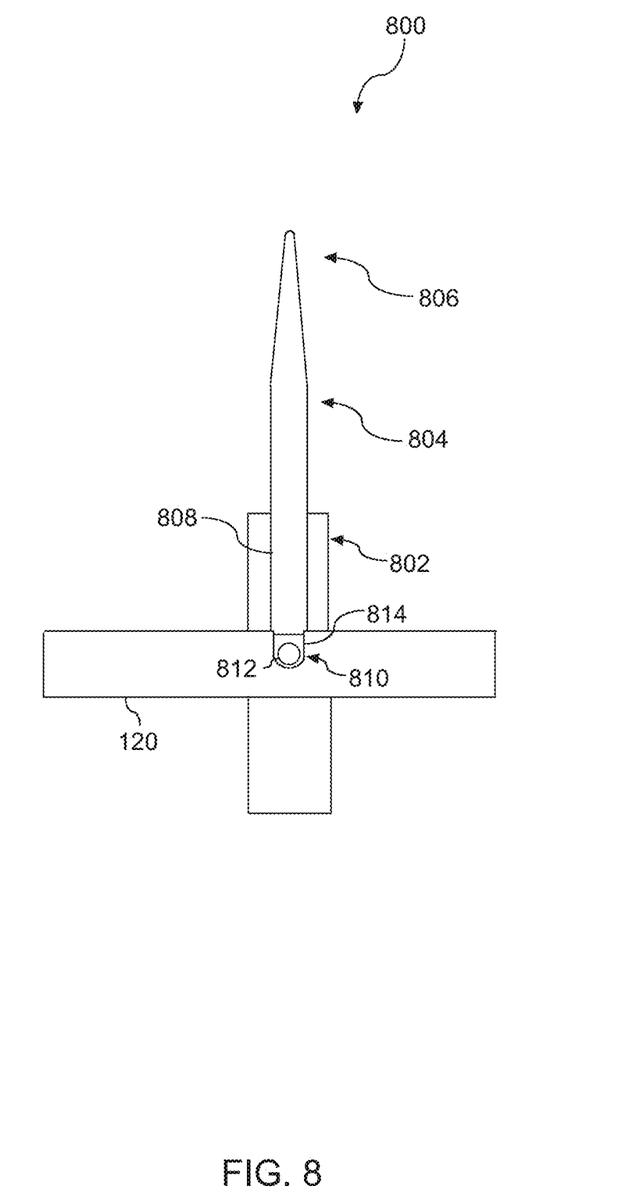
FIG. 8 depicts an example support structure according to example embodiments of the present disclosure.

FIG. 8 provides an example support structure 800 including a support structure mount 802. In this embodiment, the support structure 800 includes a removable pin 804 having a first end 806 configured to support a workpiece and a second end 808 configured to engage the support structure mount 802. The support structure mount 802 is configured to releasably secure the pin 804 to the rotatable support plate 120. The support structure mount 802 may generally include two parts, the first being a portion that extends from the rotatable support plate 120 and is configured to securely engage the shaft of the pin 804. The second part being a pivoting lower part having a pivot 810. The pivot 810 can include an axis 812 that is attached to the support structure mount 802 and a groove 814 that is machined into the rotatable support plate 120 acting as the bearing support. In this manner, the pin 804 can be inserted into the support structure mount 802 and the support structure mount 802 can provide the necessary momentum shifting to ensure that the support structure 800 is more flexible in the radial direction of the rotatable support plate 120 as compared to the azimuthal direction of the rotatable support plate 120.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing apparatus, comprising:
a plurality of heat sources configured to heat a workpiece;
a rotatable support plate operable to support the workpiece during thermal processing the rotatable support plate defining a radial direction and an azimuthal direction, the rotatable support plate comprises one or more openings, wherein the one or more openings are oriented such that a tilting momentum of the support structure in the radial direction is greater than a tilting momentum in the azimuthal direction; and
a support structure extending from the rotatable support plate, the support structure configured to contact the workpiece during thermal processing, the support structure comprising a first end and a second end, wherein the first end of the support structure is arranged to support the workpiece during thermal processing, wherein the support structure has a flexibility in the radial direction of the rotatable support plate that is greater than a flexibility in the azimuthal direction of the rotatable support plate.

2. The thermal processing apparatus of claim 1, wherein the support structure comprises a quartz material.

3. The thermal processing apparatus of claim 1, wherein the apparatus comprises a plurality of support structures, each of the support structures comprising a support pin.

4. The thermal processing apparatus of claim 1, wherein the first end of the support structure comprises a tapered end and the second end of the support structure comprises a blunt end.

5. The thermal processing apparatus of claim 1, wherein the support structure has a length of about 17 mm and a diameter of about 1.5 mm.

6. The thermal processing apparatus of claim 1, wherein the support structure comprises a base plate such that the one or more openings are configured to engage the base plate to secure the support structure to the rotatable support plate.

7. The thermal processing apparatus of claim 6, wherein the support structure comprises a key-shaped end configured to secure the support structure to the rotatable support plate.

8. The thermal processing apparatus of claim 1, wherein the support structure comprises a pivot and a counterweight.

9. The thermal processing apparatus of claim 8, wherein the pivot comprises a pin, wherein the pin is configured to be inserted into an opening on the support structure.

10. The thermal processing apparatus of claim 9, wherein the rotatable support plate comprises one or more recessed pockets configured to engage the pivot of the support structure to secure the support structure to the rotatable support plate.

11. The thermal processing apparatus of claim 1, wherein the rotatable support plate comprises a support structure mount configured to releasably secure the support structure to the rotatable support plate.

12. The thermal processing apparatus of claim 11, wherein the support structure mount comprises a pivot configured such that tilting momentum of the support structure in the radial direction is greater than in the azimuthal direction.

13. A support plate for supporting a workpiece in a thermal processing apparatus, the support plate comprising:
a base defining a radial direction and an azimuthal direction, the base comprises one or more openings, wherein the one or more openings are oriented such that a tilting momentum of the support structure in the radial direction is greater than a tilting momentum in the azimuthal direction; and
at least one support structure extending from the base, the at least one support structure configured to support the workpiece during thermal processing;
wherein the support structure has a flexibility in the radial direction of the base that is greater than a flexibility in the azimuthal direction of the base.

14. The support plate of claim 13, wherein the at least one support structure comprises a three support pins.

15. The support plate of claim 14, wherein the at least one support structure comprises a key-shaped end configured to secure the at least one support structure to the base.

16. The support plate of claim 13, wherein the at least one support structure comprises a pivot and a counterweight, wherein the base comprises one or more recessed pockets configured to engage the pivot of the at least one support structure to secure the support structure to the base.

17. The support plate of claim 13, wherein the base comprises a support structure mount configured to releasably secure the at least one support structure to the base.

18. The support plate of claim 17, wherein the support structure mount comprises a pivot configured such that tilting momentum of the support structure in the radial direction is greater than in the azimuthal direction.

* * * * *